(12) United States Patent
Okuzono et al.

(10) Patent No.: US 9,412,929 B2
(45) Date of Patent: Aug. 9, 2016

(54) THERMOELECTRIC CONVERSION MODULE

(71) Applicant: Panasonic Intellectual Property Management Co., Ltd., Osaka (JP)

(72) Inventors: Eiji Okuzono, Fukuoka (JP); Noriaki Yukawa, Osaka (JP); Hisashi Kanou, Kumamoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/820,511

(22) Filed: Aug. 6, 2015

(65) Prior Publication Data
US 2016/0049570 A1 Feb. 18, 2016

(30) Foreign Application Priority Data

Aug. 18, 2014 (JP) .................................. 2014-165716
Oct. 2, 2014 (JP) .................................. 2014-203667

(51) Int. Cl.
*H01L 35/32* (2006.01)

(52) U.S. Cl.
CPC ...................................... *H01L 35/32* (2013.01)

(58) Field of Classification Search
CPC ...................................................... H01L 35/32
See application file for complete search history.

(56) References Cited

U.S. PATENT DOCUMENTS

| 2005/0000558 A1* | 1/2005 | Moriyama | H01L 35/32 136/205 |
| 2007/0095378 A1* | 5/2007 | Ito | B60N 2/5657 136/203 |

FOREIGN PATENT DOCUMENTS

| JP | 2014-053528 | 3/2014 |
| JP | 2014-082403 | 5/2014 |

* cited by examiner

*Primary Examiner* — Susan D Leong
(74) *Attorney, Agent, or Firm* — McDermott Will & Emery LLP

(57) ABSTRACT

A thermoelectric conversion module according to the present disclosure includes a first substrate, a second substrate, and a peripheral thermoelectric conversion element group and a central thermoelectric conversion element group, each of which groups is disposed between the first substrate and the second substrate, and contains a plurality of thermoelectric conversion elements. The peripheral thermoelectric conversion element group is disposed in an area including peripheries of the first substrate and the second substrate, and the central thermoelectric conversion element group is disposed closer to a center of the first substrate and a center of the second substrate than the peripheral thermoelectric conversion element group. The plurality of thermoelectric conversion elements of the central thermoelectric conversion element group are disposed more densely than the plurality of thermoelectric conversion elements of the peripheral thermoelectric conversion element group.

7 Claims, 7 Drawing Sheets

THERMOELECTRIC CONVERSION MODULE

BACKGROUND OF THE INVENTION

1. Field of the Invention

The present disclosure relates to a thermoelectric conversion module included in various types of electronic devices.

2. Description of the Related Art

A conventional thermoelectric conversion, module is initially described with reference to the drawings. FIG. 7 is an exploded perspective view illustrating a configuration of a conventional, thermoelectric conversion module, and FIG. 8 is an outline view of the conventional thermoelectric conversion module. Thermoelectric conversion module 1 includes a plurality of thermoelectric conversion elements 2 arranged lengthwise and crosswise, and mounted on first substrate 3 and second substrate 4. The plurality of thermoelectric conversion elements 2 are connected in series by wiring pattern 5 formed on first substrate 3, and wiring pattern 5 formed on second substrate 4. Thermoelectric conversion element 6 at one end of series connection, and thermoelectric conversion element 7 at the other end of series connection are connected with extension leads 8 and 9, respectively.

As illustrated in FIG. 8, thermoelectric conversion module 1 disposed in contact with heat generator 10 converts heat generated from heat generator 10 into power, and outputs the thermoelectrically converted power to an outside of thermoelectric conversion module 1 via extension leads 8 and 9.

Unexamined Japanese Patent Publication No. 2014-82403 is known as related art literature information concerning the disclosure of this application.

SUMMARY OF THE INVENTION

A thermoelectric conversion module according to the present disclosure comprises a first substrate, a second substrate, and a peripheral thermoelectric conversion element group and a central thermoelectric conversion element group, each of which groups is disposed between the first substrate and the second substrate, and contains a plurality of thermoelectric cc avers elements. The peripheral thermoelectric conversion element group is disposed in an area including peripheries of the first substrate and the second substrate, and the central thermoelectric conversion element group is disposed closer to a center of the first substrate and a center of the second substrate than the peripheral thermoelectric conversion element group. The plurality of thermoelectric conversion elements of the central thermoelectric conversion element group are disposed more densely than the plurality of thermoelectric conversion elements of the peripheral thermoelectric conversion element group.

Another thermoelectric conversion module according to the present disclosure comprises a plurality of thermoelectric conversion elements, a first metal substrate and a second metal substrate between which the plurality of thermoelectric conversion elements are sandwiched. The first metal substrate includes a plurality of divisional substrates. The plurality of divisional substrates are disposed with clearances left between each other.

DETAILED DESCRIPTION OF THE PREFERRED EMBODIMENT

Figure 7:
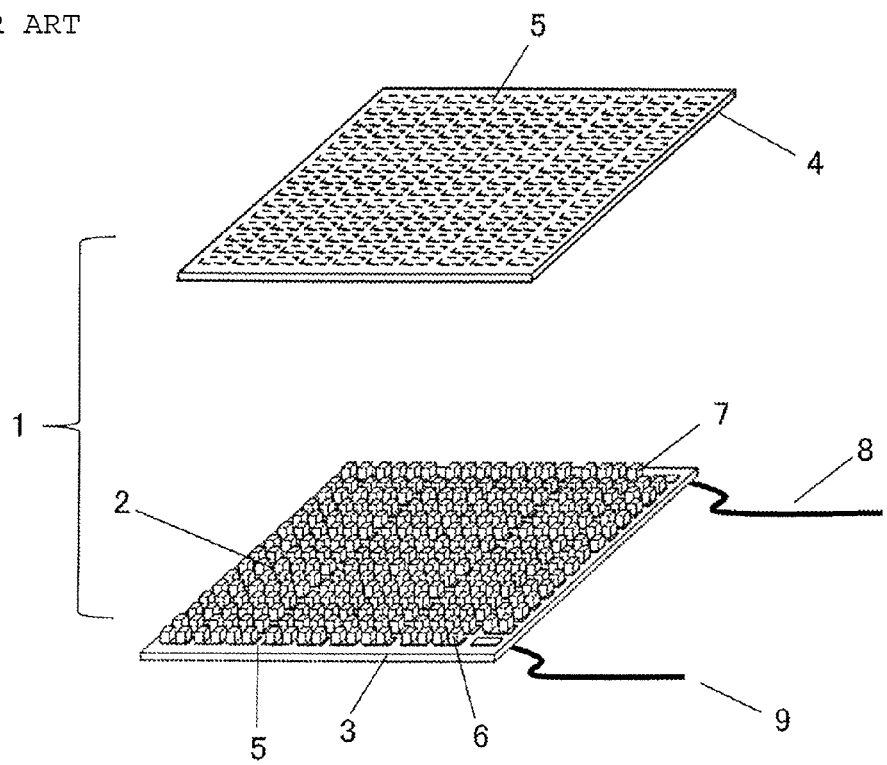
FIG. 7 is an exploded perspective view of a conventional thermoelectric conversion module.
Figure 8:
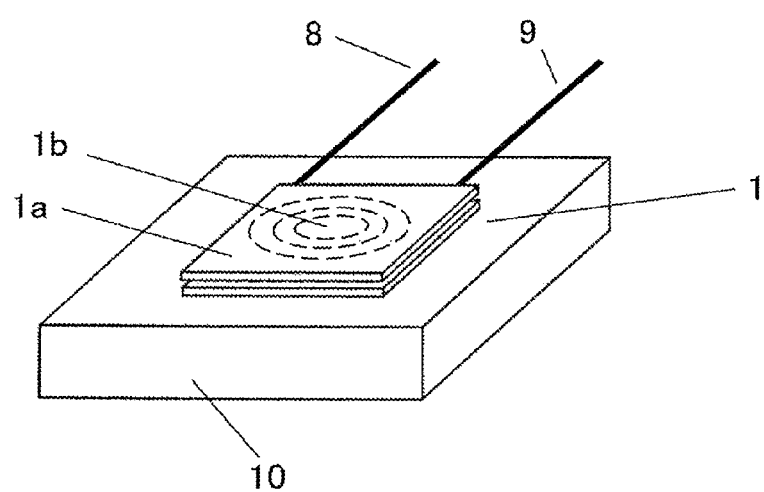
FIG. 8 is an outline view of the conventional thermoelectric conversion module.

A problem to be solved by an exemplary embodiment of the present disclosure is described below by using FIG. 7 and FIG. 8. According to conventional thermoelectric conversion module 1, a temperature of first substrate 3 of thermoelectric conversion module 1 in contact with heat generator 10 increases when thermoelectric conversion module 1 is placed on heat generator 10 and receives heat from heat generator 10. However, temperature distribution of first substrate 3 has irregularity. This irregularity of the temperature distribution is produced by radiation of heat to a surrounding environment from a side surface or other exposed portions of thermoelectric conversion module 1. Accordingly, equivalent temperature lines of first substrate 3, which lines have almost closed shapes as indicated by broken lines in FIG. 8, exhibit higher temperatures in a direction toward a center of thermoelectric conversion module 1.

In this case, a temperature in peripheral portion 1a of thermoelectric conversion module 1 differs from a temperature in central portion 1b of thermoelectric conversion module 1, and thus power produced by respective thermoelectric conversion elements 2 varies for each of thermoelectric conversion elements 2. In this situation, there arises such a problem from thermoelectric conversion module 1 that high efficiency in converting heat conducted from heat generator 10 to thermoelectric conversion elements 2 into power is not easily obtained.

For solving this problem, the present disclosure provides a thermoelectric conversion module capable of converting heat into power with high efficiency.

An exemplary embodiment according to the present disclosure is hereinafter described with reference to the drawings.

First Exemplary Embodiment

Figure 1:
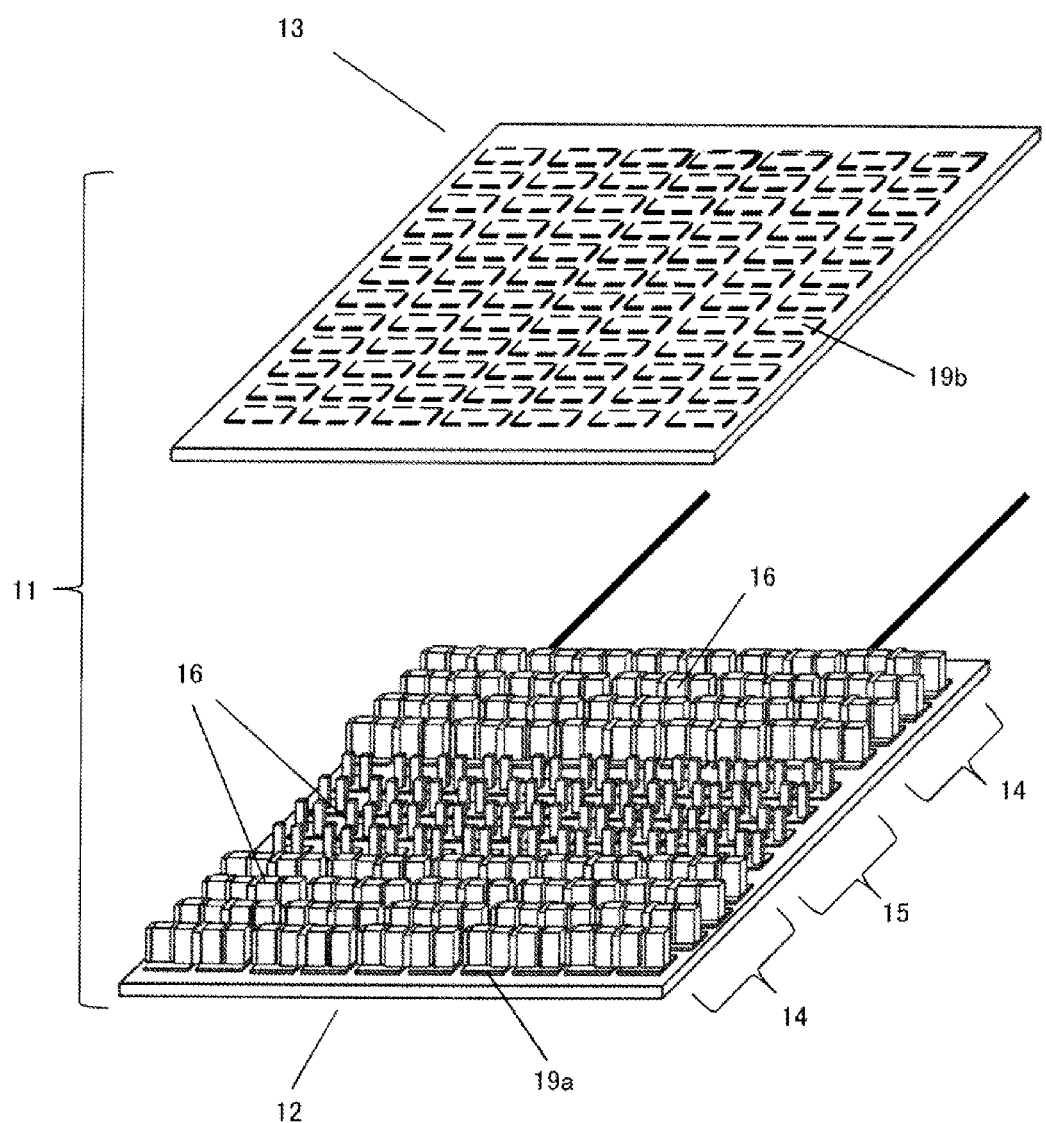
FIG. 1 is an exploded perspective view illustrating a configuration of a thermoelectric conversion module according to a first exemplary embodiment.
Figure 2:
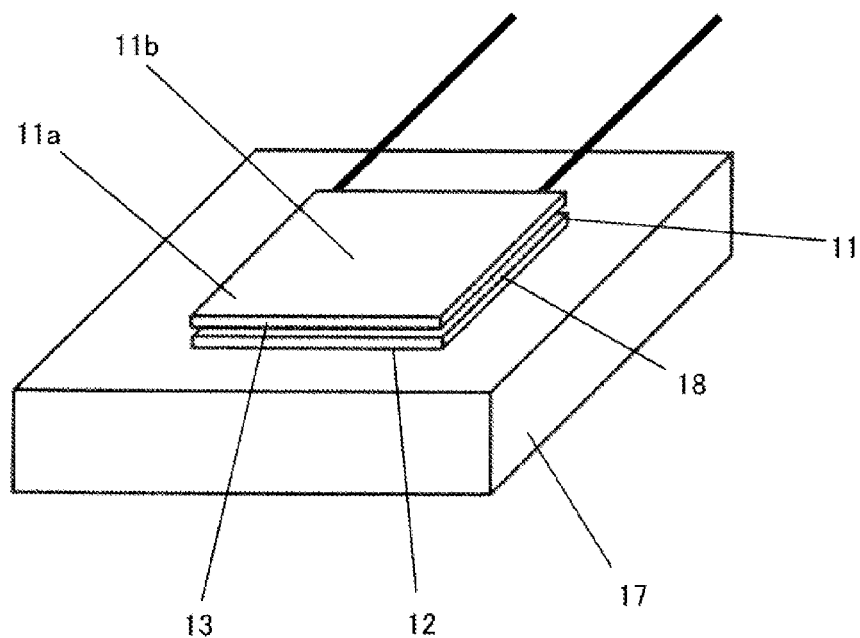
FIG. 2 is an outline perspective view of the thermoelectric conversion module according to the first exemplary embodiment.

FIG. 1 is an exploded perspective view illustrating a configuration of a thermoelectric conversion module according to a first exemplary embodiment, and FIG. 2 is an outline perspective view of the thermoelectric conversion module according to the first exemplary embodiment. Thermoelectric conversion module 11 includes first substrate 12, second substrate 13, peripheral thermoelectric conversion element groups 14, and central thermoelectric conversion element group 15.

Peripheral thermoelectric conversion element groups 14 and central thermoelectric conversion element group 15 are sandwiched between first substrate 12 and second substrate 13 when mounted on first substrate 12 and second substrate 13. Each of peripheral thermoelectric conversion element groups 14 and central thermoelectric conversion element group 15 contains a plurality of thermoelectric conversion elements 16.

As illustrated in FIG. 1, each of thermoelectric conversion elements 16 provided to constitute that peripheral thermoelectric conversion element groups 14 and central thermoelectric conversion element group 15 has a rectangular parallelepiped shape. And each of thermoelectric conversion elements 16 is mounted on an upper surface of first substrate 12, and on a lower surface of second substrate 13 (hereinafter, a surface of first substrate 12 on which thermoelectric conversion elements 16 are mounted is referred to as a first mounting surface, and a surface of second substrate 13 on which thermoelectric conversion elements 16 are mounted is referred to as a second mounting surface). More specifically, bottoms of respective thermoelectric conversion elements 16 are electrically connected with wiring pattern 19a formed on the first mounting surface of first substrate 12, and tops of respective thermoelectric conversion elements 16 are electrically connected with wiring pattern 19b formed on the second mounting surface of second substrate 13.

Peripheral thermoelectric conversion element groups 14 are positioned on first substrate 12 and second substrate 13 in areas containing peripheries of first substrate 12 and second substrate 13. On the other hand, central thermoelectric conversion element group 15 on first substrate 12 and second substrate 13 is positioned closer to a center of first substrate 12 and a center of second substrate 13 than peripheral thermoelectric conversion element groups 14. The plurality of thermoelectric conversion elements 16 included in central thermoelectric conversion element group 15 are disposed more densely than the plurality of thermoelectric conversion elements 16 included in peripheral thermoelectric conversion element groups 14.

Central thermoelectric conversion element group 15 and peripheral thermoelectric conversion element groups 14 are disposed in rectangular areas arranged in rows. Central thermoelectric conversion element group 15 is sandwiched between two peripheral thermoelectric conversion element groups 14.

Assuming herein that the plurality of thermoelectric conversion elements 16 constituting central thermoelectric conversion element group 15 are first thermoelectric conversion elements, and that the plurality of thermoelectric conversion elements 16 constituting peripheral thermoelectric conversion element groups 14 are second thermoelectric conversion elements, a cross-sectional area of each of the second thermoelectric conversion elements along a plane in parallel with the first mounting surface is larger than a cross-sectional area of each of the first thermoelectric conversion elements along a plane in parallel with the first mounting surface. In this case, thermoelectric conversion elements 16 each having a larger cross-sectional area are disposed on the periphery of thermoelectric conversion module 11 and an area around this periphery as areas requiring high mechanical strength. Accordingly, mechanical strength of thermoelectric conversion module 11 in a thickness direction, i.e., mechanical strength against a force generated in a direction from first substrate 12 to second substrate 13 increases.

The first thermoelectric conversion elements and the second thermoelectric conversion elements have uniform heights in a direction from first substrate 12 to second substrate 13 (direction perpendicular to the first mounting surface). This equalization of the heights of the first thermoelectric conversion elements and the second thermoelectric conversion elements having different cross-sectional areas allows direct connection between thermoelectric conversion elements 16 and wiring pattern 19a or wiring pattern 19b, even when thermoelectric conversion elements 16 have two different types of shape.

Central thermoelectric conversion element group 15 and peripheral thermoelectric conversion element groups 14 are disposed in parallel with each other on the first mounting surface of first substrate 12. This structure decreases processing time required when thermoelectric conversion elements 16 constituting central thermoelectric conversion element group 15 are arranged on first substrate 12, and when thermoelectric conversion elements 16 constituting peripheral thermoelectric conversion element groups 14 are arranged on first substrate 12, during steps for manufacturing thermoelectric conversion module 11.

The foregoing structure allows transmission of heat generated by heat generator 17 illustrated in FIG. 2 to thermoelectric conversion module 11, and highly efficient conversion of heat into power by a function of central thermoelectric conversion element group 15 disposed in central portion 11b of thermoelectric conversion module 11. Here, central portion 11b of thermoelectric conversion module 11 is corresponding to a portion having a higher temperature than peripheral portion 11a of thermoelectric conversion module 11.

More specifically, central portion of thermoelectric conversion module 11 as a higher temperature portion includes central thermoelectric conversion element group 15 containing the plurality of thermoelectric conversion elements 16 mounted more densely than thermoelectric conversion elements 16 in peripheral portion 11a. In this case, a large number of thermoelectric conversion elements 16 thermoelectrically convert high thermal energy, and thus heat generated by heat generator 17 can be converted into power in high efficiency while producing smaller losses.

Detailed configuration and operation of thermoelectric conversion module 11 are hereinafter described. Peripheral thermoelectric conversion element groups 14 and central thermoelectric conversion element group 15 are electrically connected with first substrate 12 and second substrate 13 when mounted between first substrate 12 and second substrate 13. Peripheral thermoelectric conversion element groups 14 and central thermoelectric conversion element group 15 are mechanically fixed to first substrate 12 and second substrate 13 via resin layer 18 made of an adhesive or the like and disposed between first substrate 12 and second substrate 13.

Figure 3:
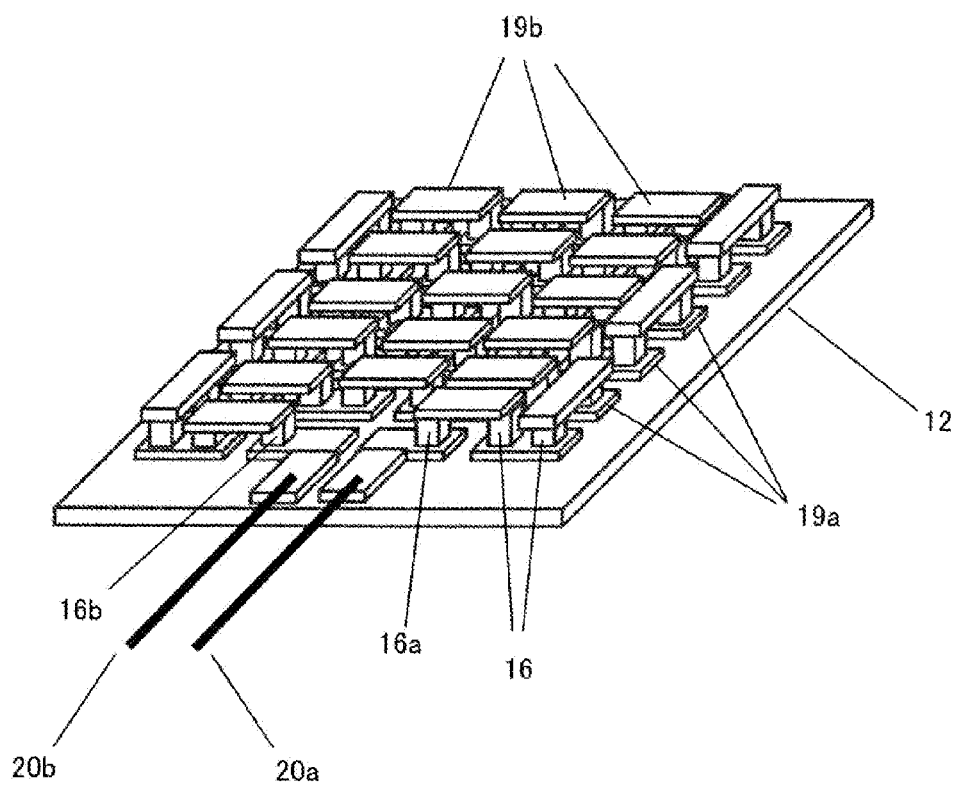
FIG. 3 is a detail view illustrating a part of the configuration of the thermoelectric conversion module according to the first exemplary embodiment.

FIG. 3 is a detail view illustrating a part of the configuration of the thermoelectric conversion module according to the first exemplary embodiment. As illustrated in FIG. 3, wiring pattern 19a formed on first substrate 12 connects respective thermoelectric conversion elements 16 constituting P-type semiconductors or N-type semiconductors in series. FIG. 3 does not show second substrate 13 provided on the upper side of wiring pattern 19b. It is preferable that each of first substrate 12 and second substrate 13 is made of material having high thermal conductivity, such as copper. Though not shown in the figure, it is preferable that a thin resin layer having excellent insulation properties, such as polyimide resin, is formed on the first mounting surface of first substrate 12 and the second mounting surface of second substrate 13. Wiring patterns 19a, and 19b are formed on this resin layer. This structure secures an insulated state of thermoelectric conversion elements 16 from first substrate 12 or second substrate 13 without lowering thermal conductivity from first substrate 12 to thermoelectric conversion elements 16, or without lowering thermoelectric conductivity from second substrate 13 to thermoelectric conversion element 16.

Extension leads 20a and 20b connect with end thermoelectric conversion elements 16a and 16b, respectively, provided at both ends of the plurality of thermoelectric conversion elements 16 connected in series.

According to the example illustrated in FIG. 3, the plurality of thermoelectric conversion elements 16 constitute a single group. However, as noted above, the plurality of thermoelectric conversion elements 16 constitute peripheral thermoelectric conversion element groups 14, and central thermoelectric conversion element group 15 according to the exemplary embodiment of the present disclosure. Peripheral thermoelectric conversion element groups 14 and central thermoelectric conversion element group 15 may be connected by extension leads 20a and 20b, or by inter-group connection wiring pattern (not shown). In addition, according to the example illustrated in FIG. 1, peripheral thermoelectric conversion element groups 14 and central thermoelectric conversion element group 15 are disposed on first substrate 12 with spaces formed between peripheral. thermoelectric conversion element groups 14 and central thermoelectric conversion element group 15. These spaces are shown only for the purpose of illustration, and peripheral thermoelectric conversion element groups 14 and central thermoelectric conversion element group 15 may be disposed in tight contact with each other. In addition, peripheral thermoelectric conversion element groups 14 and central thermoelectric conversion element group 15 may have a boundary area containing a part of mixture of element groups 14 and 15.

Thermoelectric conversion elements 16 provided within thermoelectric conversion module 11 are N-type thermoelectric conversion elements 16 all having equivalent characteristics, and P-type thermoelectric conversion elements 16 all having equivalent characteristics. Moreover, conversion characteristics of respective thermoelectric conversion elements 16 from heat into power are also equivalent for each. These conversion characteristics are dependent on specific constants of thermoelectric conversion elements 16, and a temperature difference produced between both ends of thermoelectric conversion elements 16. This temperature difference generally corresponds to a temperature difference between first substrate 12 and second substrate 13.

However, there is a limitation to a conversion volume or conversion efficiency in heat-to-power conversion achieved by each of thermoelectric conversion elements 16. Accordingly, for an area having a large heat capacity or producing a large temperature difference, it is preferable to provide a thermoelectric conversion element group which contains more densely disposed thermoelectric conversion elements 16, rather than to raise each capability of thermoelectric conversion elements 16. On the other hand, for an area having a small heat capacity or producing a small temperature difference, it is preferable to provide a thermoelectric conversion element group which contains less densely disposed thermoelectric conversion elements 16.

Figure 4:
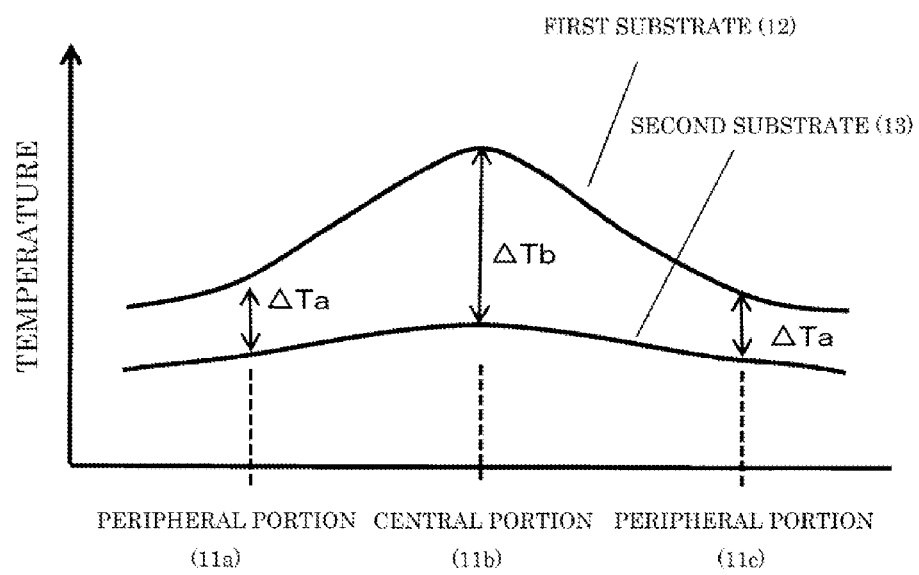
FIG. 4 is a chart illustrating temperature distribution of the thermoelectric conversion module according to the first exemplary embodiment.

FIG. 4 is a chart illustrating temperature distribution of the thermoelectric conversion module according to the first exemplary embodiment. As illustrated in FIG. 4, temperature distribution of first substrate 12 of thermoelectric conversion module 11 as a substrate in contact with heat generator 17 is different from temperature distribution of second substrate 13 as a substrate not in contact with heat generator 17. Concerning first substrate 12 in direct contact with heat generator 17, a temperature of central portion 11b not exposed to the external environment easily rises in accordance with a temperature rise of heat generator 17, while a temperature of peripheral portion 11a partially exposed to the external environment does not easily rise in comparison with the temperature of central portion 11b.

On the other hand, concerning second substrate 13 not in direct contact with heat generator 17, a temperature difference between peripheral portion 11a and central portion 11b is hardly produced in comparison with a curve of temperature characteristics of first substrate 12. This condition of second substrate 13 comes from a state that an entire surface of second substrate 13 on the side opposite to heat generator 17 is exposed to the external environment.

Accordingly, concerning thermoelectric conversion module 11, temperature difference $\Delta Tb$ between first substrate 12 and second substrate 13 in central portion 11b is constantly larger than temperature difference $\Delta Ta$ between first substrate 12 and second. substrate 13 in peripheral portion 11a. In this case, temperature difference $\Delta Tb$ in central portion 11b becomes a large value, and thus power generated by respective thermoelectric conversion elements 16 increases. However, the heat capacity of central portion 11b in first substrate 12 simultaneously increases, and thus central portion 11b requires a thermoelectric conversion element group matching with a large heat capacity so as to perform thermoelectric conversion with high efficiency.

Accordingly, it is preferable in thermoelectric conversion module 11 that central thermoelectric conversion element group 15, which contains thermoelectric conversion elements 16 disposed highly densely, is provided on central portion 11b which easily accumulates heat supplied from heat generator 17 and thus has a large heat capacity. On the other hand, it is preferable that peripheral thermoelectric conversion element groups 14, which contains thermoelectric conversion elements 16 disposed less densely than thermoelectric conversion elements 16 of central thermoelectric conversion element group 15, is provided on peripheral portion 11a which does not easily accumulate heat supplied from heat generator 17 and thus has a smaller heat capacity than the heat capacity of central portion 11b.

According to this structure, a large number of highly densely disposed thermoelectric conversion elements 16 perform thermoelectric conversion in an area having a large capacity for heat received by thermoelectric conversion module 11 from heat generator 17. As a result, thermoelectric conversion efficiency of thermoelectric conversion module 11 increases.

In addition, at least two types of solder having different melting points are used for manufacturing thermoelectric conversion module 11. More specifically, thermoelectric conversion module 11 is manufactured by using first solder having a predetermined melting point, and second solder having a melting point lower than the melting point of the first solder.

Assuming that the plurality of thermoelectric conversion elements 16 in central thermoelectric conversion element group 15 are the first thermoelectric conversion elements, the first thermoelectric conversion elements are connected with first wiring pattern 19a and second wiring pattern 19b via the first solder. On the other hand, assuming that the plurality of thermoelectric conversion elements 16 in peripheral thermoelectric conversion element groups 14 are the second thermoelectric conversion elements, the second thermoelectric conversion elements are connected with first wiring pattern 19a and second wiring pattern 19b via the second solder.

As noted herein, at least two types of solder having different melting points are used. In this case, solder having a higher melting point is used for connection of central thermoelectric conversion element group 15, while solder having a lower melting point is used for connection of peripheral thermoelectric conversion element groups 14. This structure secures certain tolerance for melting of connection solder in accordance with temperature rises of the thermoelectric conversion elements groups. Moreover, the use of at least two types of solder having different melting points in manufacturing thermoelectric conversion module 11 allows separation of a step for attaching the first thermoelectric conversion elements to first wiring pattern 19a from a step for attaching the second thermoelectric conversion elements to first wiring pattern 19a. This separation of the steps reduces manufacturing time required for each of the steps, and thus reduces the entire manufacturing time of thermoelectric conversion module 11.

Figure 5:
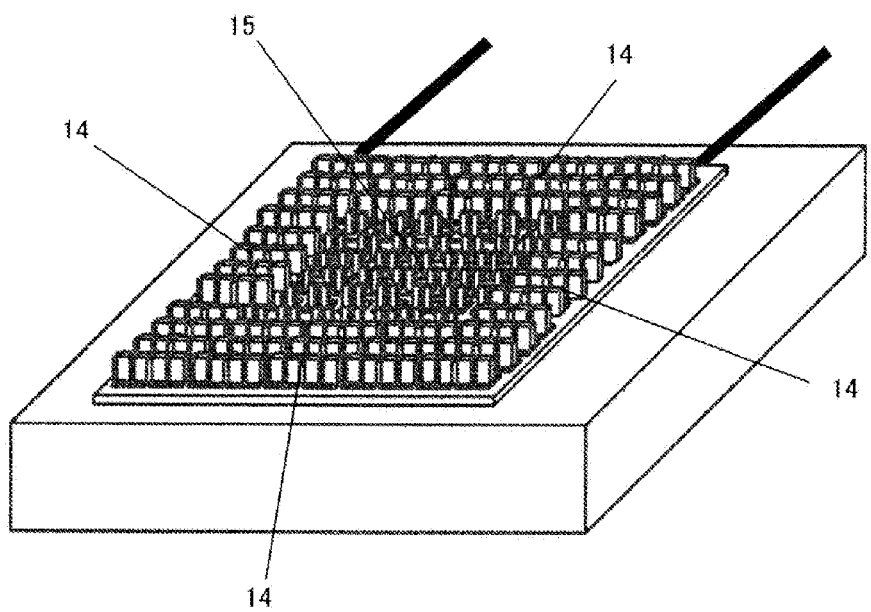
FIG. 5 is a perspective view illustrating a configuration of a thermoelectric conversion module according to a modified example of the first exemplary embodiment.

According to the description with reference to FIG. 1 presented by way of example, peripheral thermoelectric conversion element groups 14 and central thermoelectric conversion element group 15 each disposed in a substantially rectangular area are positioned such that central thermoelectric conversion element group 15 is sandwiched between two peripheral thermoelectric conversion element groups 14. However, peripheral thermoelectric conversion element groups 14 and central thermoelectric conversion element group 15 may be disposed in arrangement different from the arrangement of the structure illustrated in FIG. 1. FIG. 5 is a perspective view illustrating a configuration of a thermoelectric conversion module according to a modified example of the first exemplary embodiment. As illustrated in FIG. 5, peripheral thermoelectric conversion element group 14 is disposed in a frame-shaped area on first substrate 12, and central thermoelectric conversion element group 15 is disposed in an area inside the frame. Alternatively, peripheral thermoelectric conversion element group 14 may be disposed in a toroidal area on first substrate 12, and central thermoelectric conversion element group 15 may be disposed inside the toroidal shape. In other words, peripheral thermoelectric conversion element group 14 and central thermoelectric conversion element group 15 may be concentrically disposed. When central thermoelectric conversion element group 15 is surrounded by peripheral thermoelectric conversion element group 14 as in these examples, mechanical strength of the periphery of thermoelectric conversion module 11 and an area around this periphery increases.

Furthermore, central thermoelectric conversion element group 15 may be configured to gradually decrease intervals of thermoelectric conversion elements 16 in a direction toward the center of the first mounting surface of first substrate 12 or the second mounting surface of second substrate 13, i.e., toward the center of thermoelectric conversion module 11. On the other hand, peripheral thermoelectric conversion element groups 14 may be configured to gradually increase intervals of thermoelectric conversion elements 16 in a direction toward the periphery of first substrate 12 or the second substrate 13. According to this structure, shapes of thermoelectric conversion elements 16 constituting central thermoelectric conversion element group 15, and shapes of thermoelectric conversion elements 16 constituting peripheral thermoelectric conversion element groups 14 are not required to be different shapes but may be uniform shapes. Accordingly, increase in a number of part types is not needed for manufacturing thermoelectric conversion module 11 arranged such that the plurality of thermoelectric conversion elements 16 are more densely disposed in central thermoelectric conversion element group 15 than in peripheral thermoelectric conversion element groups 14.

Figure 6:
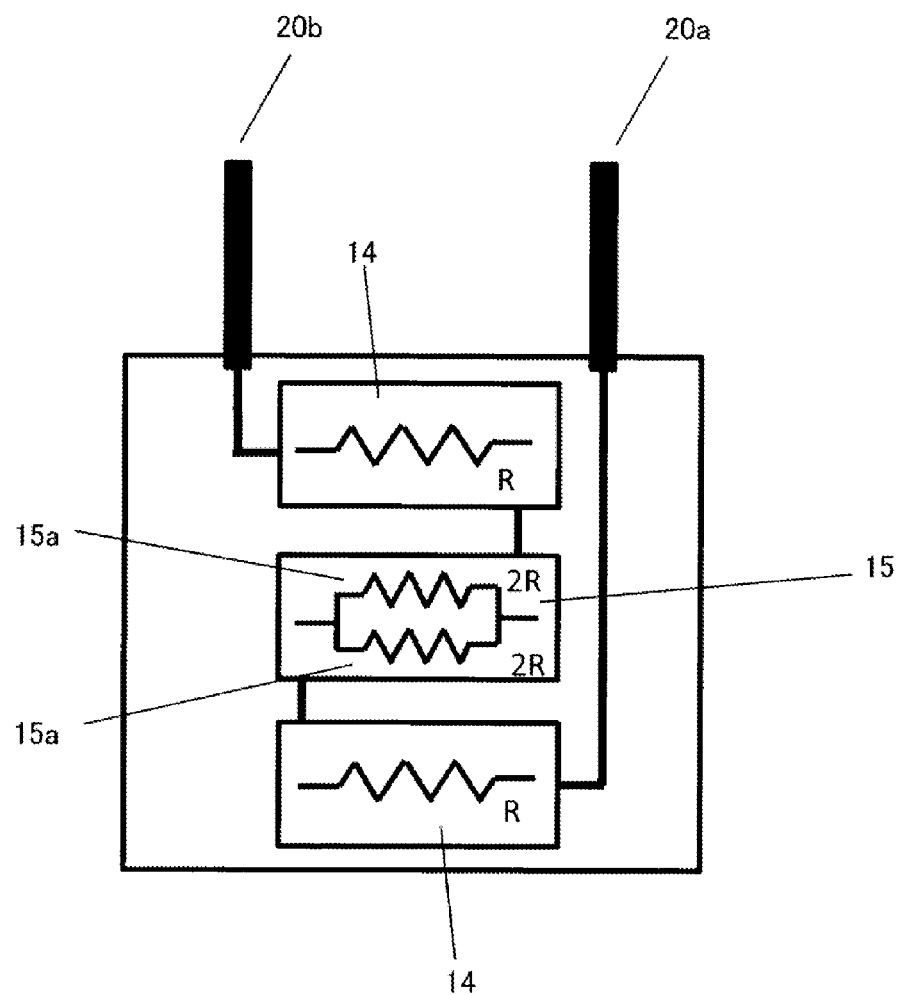
FIG. 6 is a schematic diagram illustrating electric connection of a thermoelectric conversion module according to another modified example of the first exemplary embodiment.

FIG. 6 is a schematic diagram illustrating electric connection of a thermoelectric conversion module according to another modified example of the first exemplary embodiment. As illustrated in FIG. 6, a connection state of thermoelectric conversion elements 16 of peripheral thermoelectric conversion element groups 14 disposed on first substrate 12 may be different from a connection state of thermoelectric conversion elements 16 of central thermoelectric conversion element group 15 disposed on first substrate 12. For example, suppose that a number of thermoelectric conversion elements 16 constituting central thermoelectric conversion element group 15 is twice larger than a number of thermoelectric conversion elements 16 constituting each of peripheral thermoelectric conversion element groups 14. In this case, all thermoelectric conversion elements 16 of peripheral thermoelectric conversion element groups 14 may be connected in series. On the other hand, each of thermoelectric conversion elements 16 of central thermoelectric conversion element group 15 may be divided into equal halves such that each cross-sectional area of thermoelectric conversion elements 16 of central thermoelectric conversion element group 15 becomes a half. Then, two series connection parts 15a containing the same number of equal halves of thermoelectric conversion elements 16 connected in series may be formed and connected in parallel.

In this case, voltage of central thermoelectric conversion element group 15 becomes half of voltage that is produced if all thermoelectric conversion elements 16 are connected in series. However, current allowed to be supplied becomes two times larger than current that is produced if all thermoelectric conversion elements 16 are connected in series. In other words, the connection state of thermoelectric conversion elements 16 of peripheral thermoelectric conversion element groups 14, and the connection state of thermoelectric conversion elements 16 of central thermoelectric conversion element group 15 are allowed to vary in response to changes of wiring patterns 19a and 19b made in accordance with necessary output voltage or output current. In addition, resistance between extension leads 20a and 20b is allowed to vary in accordance with changes of the connection state of thermoelectric conversion elements 16 of peripheral thermoelectric conversion element groups 14 and the connection state of thermoelectric conversion elements 16 of central thermoelectric conversion element group 15 similarly to above.

According to the example illustrated in FIG. 6, approximately the same number of equal halves of thermoelectric conversion elements 16 connected in series are disposed in parallel in central thermoelectric conversion element group 15. According to this structure, power is generated from two series connection parts 15a of central thermoelectric conversion element group 15. In this case, circulating current is produced when electromotive force generated from respective series connection parts 15a becomes unbalanced. It is therefore preferable that electromotive force generated from each of two series connection parts 15a becomes substantially uniform so as not to produce circulating current.

It is also preferable that peripheral thermoelectric conversion element groups 14 and central thermoelectric conversion element group 15 have substantially equivalent impedance. In this exemplary embodiment, impedance of each of peripheral thermoelectric conversion element groups 14 and central thermoelectric conversion element group 15 is set to R. In this case, power losses produced by peripheral thermoelectric conversion element groups 14 and by central thermoelectric conversion element group 15 become substantially uniform, and thus generated output is not lowered by a rise of a power loss in a particular area.

As discussed above, temperature difference $\Delta Tb$ between first substrate 12 and second substrate 13 in central portion 11b increases as well as rises of an absolute value of temperature and a heat capacity in this area, when compared with other areas as illustrated in FIG. 4. The plurality of thermoelectric conversion elements 16 are highly densely disposed in central portion 11b between first substrate 12 and second substrate 13, constituting central thermoelectric conversion element group 15. The increase in temperature difference $\Delta Tb$, and the presence of a large number of thermoelectric conversion elements 16 raise power output from central thermoelectric conversion element group 15. On the other hand, increase in temperature difference $\Delta Tb$ raises heat conduction from first substrate 12 to second substrate 13 via thermoelectric conversion elements 16 in central portion 11b. This heat conduction decreases temperature difference $\Delta Tb$ between first substrate 12 and second substrate 13. In this case, the heat conduction may prevent a rise of power output from thermoelectric conversion elements 16.

It is therefore preferable that each cross-sectional area of the plurality of thermoelectric conversion elements 16 constituting central thermoelectric conversion element group 15 along the plane in parallel with the first mounting surface is smaller than each cross-sectional area of the plurality of thermoelectric conversion elements 16 constituting peripheral thermoelectric conversion element groups 14 along the plane in parallel with the first mounting surface. In this case, the heat conduction from first substrate 12 to second substrate 13 via thermoelectric conversion elements 16 in central thermoelectric conversion element group 15 decreases. As a result, decrease in temperature difference. $\Delta Tb$ between first substrate 12 and second substrate 13 is avoidable, and thus thermoelectric conversion efficiency and power output in central thermoelectric conversion element group 15 both increase.

However, reduction of each cross-sectional area of thermoelectric conversion elements 16 increases each resistance of thermoelectric conversion elements 16. The increase in resistance prevents a rise of power output from thermoelectric conversion elements 16. In general, power generation amount P of thermoelectric conversion elements 16 is calculated as $P=(S^2 \cdot \Delta Tb^2)/(4 \cdot Ri)$, where S is Seebeck coefficient and Ri is internal resistance of thermoelectric conversion elements 16. Accordingly, for increasing power generation amount P, it is only required to obtain a larger increase rate of a square of temperature difference $\Delta Tb$ than an increase rate of internal resistance Ri before and after reduction of each cross-sectional area of thermoelectric conversion elements 16.

For example, a relation $((Rc-Re)/Re)<((\Delta Tb2-\Delta Tb1)^2/\Delta Tb1^2)$ is only required to hold, where Re is internal resistance before reduction of each cross-sectional area of thermoelectric conversion elements 16 in peripheral thermoelectric conversion element groups 14, Rc is internal resistance after reduction of each cross-sectional area of thermoelectric conversion elements 16 in central thermoelectric conversion element group 15, $\Delta Tb1$ is temperature difference in central portion 11b when the same thermoelectric conversion elements 16 are used for peripheral thermoelectric conversion element groups 14 and central thermoelectric conversion element group 15, and $\Delta Tb2$ is temperature difference in central portion 11b when thermoelectric conversion elements 16 each having a reduced cross-sectional area is used for central thermoelectric conversion element group 15.

When this relation holds, thermoelectric conversion efficiency of central thermoelectric conversion element group 15 improves by reduction of each cross-sectional area of thermoelectric conversion elements 16.

According to this exemplary embodiment, central thermoelectric conversion element group 15 is configured to maintain temperature difference $\Delta Tb$ between first substrate 12 and second substrate 13 in the state of reduction of each cross-sectional area of thermoelectric conversion elements 16 of central thermoelectric conversion element group 15. However, the plurality of thermoelectric conversion elements 16 in central thermoelectric conversion element group 15 are disposed more densely than the plurality of thermoelectric conversion elements 16 in peripheral thermoelectric conversion element groups 14. In this case, heat conduction. from first substrate 12 to second substrate 13 via thermoelectric conversion elements 16 becomes larger in central thermoelectric conversion element group 15 than in peripheral thermoelectric conversion element groups 14 as noted above. Accordingly, highly dense positioning of thermoelectric conversion elements 16 in central thermoelectric conversion element group 15 can prevent or reduce enlargement of the difference between $\Delta Ta$ and $\Delta Tb$, in comparison with positioning of the plurality of thermoelectric conversion elements 16 at equal density for central thermoelectric conversion element group 15 and peripheral thermoelectric conversion element groups 14.

As a result, deformation and a warp produced in first substrate 12 by heat decreases, and mechanical stress applied to thermoelectric conversion elements 16 also decreases. Accordingly, reliability of thermoelectric conversion module 11 further improves.

Second Exemplary Embodiment

Figure 9:
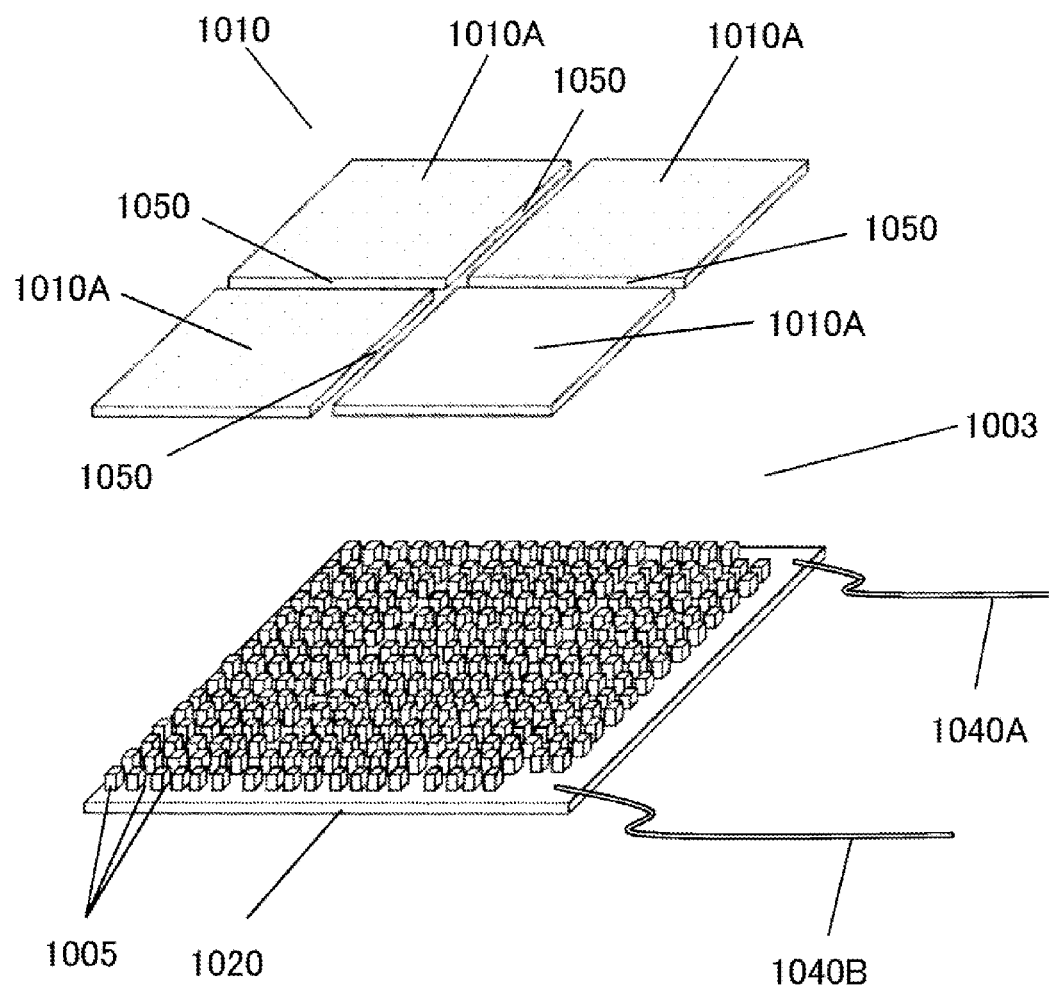
FIG. 9 is an exploded perspective view of a thermoelectric conversion module according to a second exemplary embodiment.
Figure 10:
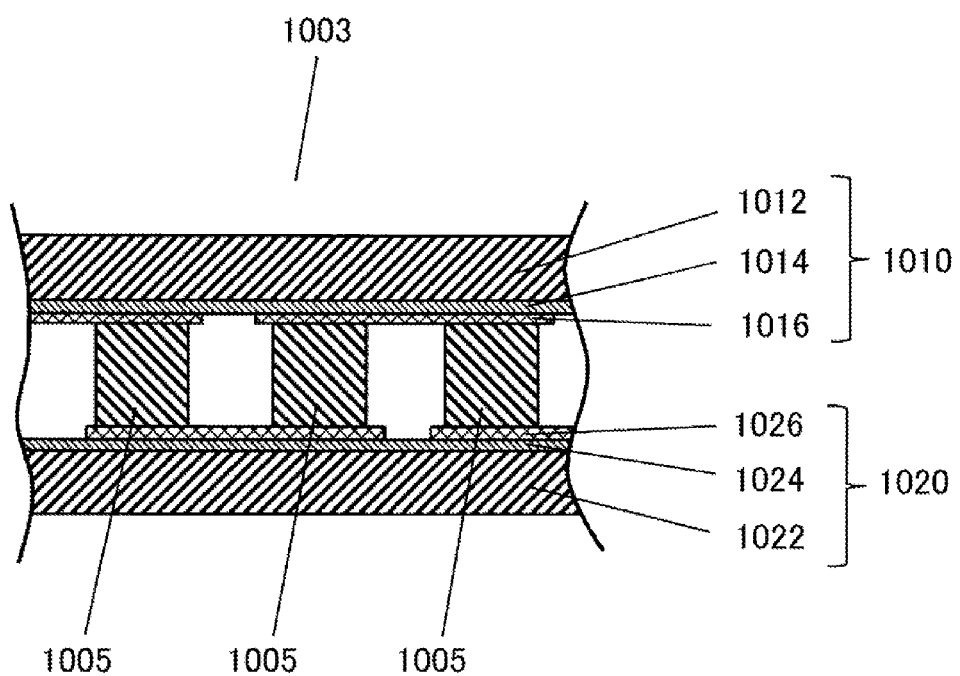
FIG. 10 is a local cross-sectional view of the thermoelectric conversion module according to the second exemplary embodiment.

FIG. 9 is an exploded perspective view illustrating a thermoelectric conversion module according to a second exemplary embodiment, and FIG. 10 is a local cross-sectional view of the thermoelectric conversion module according to the second exemplary embodiment.

As illustrated in FIGS. 9 and 10, thermoelectric conversion module 1003 according to the second exemplary embodiment includes first metal substrate 1010 and second metal substrate 1020 facing to each other, and a plurality of thermoelectric conversion elements 1005 disposed between first metal substrates 1010 and second metal substrates 1020. Thermoelectric conversion elements 1005 are disposed in a predetermined arrangement state in a horizontal direction, and constituted by a plurality of P-type thermoelectric conversion elements, and a plurality of N-type thermoelectric conversion elements. The P-type and N-type thermoelectric conversion elements have the same rectangular parallelepiped external shape.

First metal substrate 1010 is constituted by four divisional substrates 1010A. On the other hand, second metal substrate 1020 is constituted by one substrate.

As illustrated in FIG. 10, each of divisional substrates 1010A constituting first metal substrate 1010 includes insulation layer 1014 formed on one surface of copper plate 1012, and first electrodes 1016 overlapped with insulation layer 1014. First electrodes 1016 are made of copper. Insulation layer 1014 is made of polyimide resin or the like.

Similarly to first metal substrate 1010, second metal substrate 1020 includes insulation layer 1024 formed on one surface of copper plate 1022, and second electrodes 1026 overlapped with insulation layer 1024. Second electrodes 1026 are made of copper. Insulation layer 1024 is made of polyimide resin or the like.

First electrodes 1016 and second electrodes 1026 are disposed on first metal substrate 1010 and second metal substrate 1020, respectively, such that the P-type thermoelectric conversion elements and the N-type thermoelectric conversion elements are alternately connectable in series.

Thermoelectric conversion module 1003 is wired for each of respective divisional substrates 1010A of first metal substrate 1010, and respective areas of second metal substrate 1020 corresponding to respective divisional substrates 1010A, such that the respective areas connect with one another on second metal substrate 1020. In other words, four divisional units as divisions of thermoelectric conversion module 1003 formed for each of divisional substrates 1010A and the areas of second metal substrate 1020 in correspondence with respective divisional substrates 1010A connect with one another via wiring formed on second metal substrate 1020.

Thermoelectric conversion module 1003 extracts power output through leads 1040A and 1040B connected with both end portions of one side of a rectangular shape of second metal substrate 1020.

Thermoelectric conversion module 1003 may raise output voltage by connecting all the divisional units in series, or may raise output current by connecting all the divisional units in parallel. Alternatively, thermoelectric conversion module 1003 may be connected by a combination of series and parallel connections of the divisional units.

First metal substrate 1010 corresponds to a high temperature side substrate which is to be heated, and second metal substrate 1020 corresponds to a low temperature side substrate which is to be cooled. Accordingly, thermoelectric conversion module 1003 generates power by heating first metal substrate 1010, and cooling second metal substrate 1020. Conversely, supply of power to leads 1040A and 1040B of thermoelectric conversion module 1003 heats first metal substrate 1010, and cools second metal substrate 1020.

As noted above, first metal substrate 1010 is constituted by four divisional substrates 1010A. Clearances 1050 are formed between adjoining divisional substrates 1010A. In this case, even when a difference in volume between first metal substrate 1010 and second metal substrate 1020 is produced due to thermal expansion deformation as a result of heating of first metal substrate 1010 and cooling of second metal substrate 1020 for power generation from thermoelectric conversion module 1003, this difference in deformation volume is absorbed by clearances 1050 between divisional substrates 1010A. Accordingly, this structure prevents generation of deformation (warp) of first metal substrate 1010 and second metal substrate 1020 in the thickness direction, and therefore avoids damage to thermoelectric conversion module 1003.

According to this exemplary embodiment, first metal substrate 1010 on the heating side is divided into the plurality of divisional substrates 1010A. The thermal expansion deformation volume during power generation of thermoelectric conversion module 1003 is larger in first metal substrate 1010 than in second metal substrate 1020. In this case, thermal stress applied to thermoelectric conversion elements becomes lower in a structure which divides first metal substrate 1010 into the plurality of divisional substrates 1010A, than in a structure which divides second metal substrate 1020 into a plurality of divisional parts. It is therefore preferable that first metal substrate 1010 is divided into the plurality of divisional substrates 1010A. However, the substrate to be divided is not limited to first metal substrate 1010. Even when the cooled side metal substrate (second metal substrate 1020 in this exemplary embodiment) is divided into a plurality of divisional substrates, the thermal expansion deformation volume difference produced between first metal substrate 1010 and second metal substrate 1020 is absorbed by clearances 1050 between the divisional substrates of second metal substrate 1020.

The number of divisions of divisional substrates 1010A may be appropriately varied in accordance with a size of thermoelectric conversion module 1003, and the thermal expansion deformation volumes of first metal substrate 1010 and second metal substrate 1020.

While one of first metal substrate 1010 and second metal substrate 1020 is only required to be divided, such a configuration may be considered which divides both first metal substrate 1010 and second metal substrate 1020 into parts formed such that the parts of first metal substrate 1010 and the parts of second metal substrate 1020 are different in division size. However, it is preferable, in view of wiring and mechanical strength, that one of first metal substrate 1010 and second metal substrate 1020 is formed by not-divided one substrate for constituting thermoelectric conversion module 1003 by connection of respective divisional units.

According to thermoelectric conversion module 1003 in this exemplary embodiment, thermoelectric conversion elements 1005 are mounted on each of respective divisional substrates 1010A of first metal substrate 1010, for example. Then, respective divisional substrates 1010A including thermoelectric conversion elements 1005 are disposed by use of a jig (not shown) at predetermined positions of second metal substrate 1020 constituted by one substrate. Thermoelectric conversion elements 1005 are arranged by the jig in matrix with a constant pitch. Each end surface of thermoelectric conversion elements 1005 is soldered to first electrode 1016 and second electrode 1026. The respective divisional units of thermoelectric conversion module 1003 associated respective divisional substrates 1010A, and with the respective areas of second metal substrate 1020 corresponding to respective divisional substrates 1010A, are connected by wiring formed on second metal substrate 1020, when respective substrates 1010A containing thermoelectric conversion elements 1005 are positioned. on second metal substrate 1020. This structure facilitates assembly of thermoelectric conversion module 1003, and therefore increases productivity.

Thermoelectric conversion module 1003 thus constructed is applicable to a power generating device capable of extracting predetermined power from leads 1040A and 1040B based on seebeck effect by heating first metal substrate 1010 and cooling second metal substrate 1020, for example, similarly to the conventional technology. Alternatively, when predetermined power is supplied to leads 1040A and 1040B, first metal substrate 1010 and second metal substrate 1020 come into a heated state and a cooled state, respectively, for example. In this case, thermoelectric conversion module 1003 is capable of functioning as a cooling device or the like.

Thermoelectric conversion mod 1003 is advantageous in increasing power extraction when applied to a power generating device.

More specifically, thermoelectric conversion module 1003 according to this exemplary embodiment includes first metal substrate 1010 constituted by the plurality of divisional substrates 1010A disposed with clearances 1050 between one another. Even when a thermal expansion deformation volume of first metal substrate 1010 is different from a thermal expansion deformation volume of second metal substrate 1020, deformation of first metal substrate 1010 and second metal substrate 1020 caused by the difference in the deformation volume is absorbed by clearances 1050 between divisional substrates 1010A. This structure allows use of metal for substrates constituting thermoelectric conversion module 1003 between which thermoelectric conversion elements 1005 are sandwiched, and enlargement of areas of the metal substrates. In this case, the number of thermoelectric conversion elements 1005 allowed to be mounted on thermoelectric conversion module 1003 increases. In addition, thermoelectric conversion module 1003 is easily made into one piece body by using wiring formed on second metal substrate 1020 for connecting respective divisional substrates 1010A of first metal substrate 1010.

A division number and an area of first metal substrate 1010, or size setting of clearances between respective divisional substrates 1010A of first metal substrate 1010 may be appropriately determined in consideration of thermal expansion deformation volumes of first metal substrate 1010 and second metal substrate 1020, working efficiency of respective divisional substrates 1010A at the time of positioning of respective divisional substrates 1010A.

Moreover, a difference in thermal expansion deformation volume between first metal substrate 1010 and second metal substrate 1020 is absorbable by clearances 1050 between divisional substrates 1010A of first metal substrate 1010 even when thermoelectric conversion module 1003 having this configuration is applied for the purpose of cooling. Accordingly, thermoelectric conversion module 1003 is advantageous in size enlargement, and enhances cooling effect.

The exemplary embodiments described herein are presented only for easy understanding of the present disclosure. Any materials, shapes, and assembling methods of respective constituent elements of thermoelectric conversion modules 11 and 1003 described, in the exemplary embodiments may be modified or changed in various manners. It is therefore not intended that the present disclosure be limited to the exemplary embodiments in any way.

What is claimed is:

1. A thermoelectric conversion module comprising:
    a first substrate;
    a second substrate; and
    a peripheral thermoelectric conversion element group and a central thermoelectric conversion element group, each of which groups is disposed between the first substrate and the second substrate, and contains a plurality of thermoelectric conversion elements,
    wherein the peripheral thermoelectric conversion element group is disposed in an area including peripheries of the first substrate and the second substrate,
    the central thermoelectric conversion element group is disposed closer to a center of the first substrate and a center of the second substrate than the peripheral thermoelectric conversion element group, and
    the plurality of thermoelectric conversion elements of the central thermoelectric conversion element group are disposed more densely than the plurality of thermoelectric conversion elements of the peripheral thermoelectric conversion element group.

2. The thermoelectric conversion module according to claim 1, wherein
    the central thermoelectric conversion element group includes a plurality of first thermoelectric conversion elements, and the peripheral thermoelectric conversion element group includes a plurality of second thermoelectric conversion elements,
    the first thermoelectric conversion elements and the second thermoelectric conversion elements are mounted on a first mounting surface of the first substrate, and
    a cross-sectional area for each of the first thermoelectric conversion elements along a plane in parallel with the first mounting surface is smaller than a cross-sectional area for each of the second thermoelectric conversion elements along a plane in parallel with the first mounting surface.

3. The thermoelectric conversion module according to claim 1, wherein
    the central thermoelectric conversion element group and the peripheral thermoelectric conversion element group are disposed in rectangular areas arranged in rows, and
    the central thermoelectric conversion element group is sandwiched between the two peripheral thermoelectric conversion element groups.

4. The thermoelectric conversion module according to claim 1, wherein the central thermoelectric conversion element group is surrounded by the peripheral thermoelectric conversion element group.

5. The thermoelectric conversion module according to claim 1, wherein
    the plurality of thermoelectric conversion elements included in the central thermoelectric conversion element group are arranged such that intervals between the plurality of thermoelectric conversion elements gradually decrease in a direction toward the center of the first substrate or in a direction toward the center of the second substrate, and
    the plurality of thermoelectric conversion elements included in the peripheral thermoelectric conversion element group are arranged such that intervals between the plurality of thermoelectric conversion elements gradually increase in a direction toward the periphery of the first substrate or in a direction toward the periphery of the second substrate.

6. The thermoelectric conversion module according to claim 2, wherein a height of the first thermoelectric conversion elements and a height of the second thermoelectric conversion elements in a direction from the first substrate to the second substrate are uniform.

7. The thermoelectric conversion module according to claim 6 further comprising:
    a first wiring pattern formed on the first substrate; and
    a second wiring pattern formed on the second substrate,
    wherein the first thermoelectric conversion elements are connected with the first wiring pattern and the second wiring pattern via first solder,
    the second thermoelectric conversion elements are connected with the first wiring pattern and the second wiring pattern via second solder, and
    a melting point of the second solder is lower than a melting point of the first solder.

* * * * *